United States Patent
Panteleev et al.

(10) Patent No.: US 8,699,396 B2
(45) Date of Patent: Apr. 15, 2014

(54) BRANCH METRICS CALCULATION FOR MULTIPLE COMMUNICATIONS STANDARDS

(75) Inventors: Pavel A. Panteleev, Moscow (RU); Elyar E. Gasanov, Moscow (RU); Ilya V. Neznanov, Moscow (RU); Andrey P. Sokolov, Moscow (RU); Yurii S. Shutkin, Moscow (RU)

(73) Assignee: LSI Corporation, San Jose, CA (US)

( * ) Notice: Subject to any disclaimer, the term of this patent is extended or adjusted under 35 U.S.C. 154(b) by 174 days.

(21) Appl. No.: 13/156,580

(22) Filed: Jun. 9, 2011

(65) Prior Publication Data

US 2012/0134325 A1 May 31, 2012

(30) Foreign Application Priority Data

Nov. 29, 2010 (RU) .............................. 2010148337

(51) Int. Cl.
*H04W 72/04* (2009.01)
*H04W 4/06* (2009.01)

(52) U.S. Cl.
USPC ........................................................ 370/312

(58) Field of Classification Search
USPC ................................................ 370/254–340
See application file for complete search history.

(56) References Cited

U.S. PATENT DOCUMENTS

| | | | |
|---|---|---|---|
| 7,107,509 B2 | 9/2006 | Bickerstaff et al. | 714/780 |
| 2009/0300463 A1* | 12/2009 | Purkovic et al. | 714/755 |
| 2012/0066566 A1* | 3/2012 | Cui et al. | 714/763 |

OTHER PUBLICATIONS

Title: Area-Efficient High Throughput MAP Decoder Architecture, Authors: Ju Lee Naresh R. Shanbhag and Andrew C. Singer, Journal: IEEE Transaction On Very High Scale Integration System, vol. 13, No. 8, Aug. 2005.*

* cited by examiner

*Primary Examiner* — Ayaz Sheikh
*Assistant Examiner* — Debebe Asefa
(74) *Attorney, Agent, or Firm* — Christopher P. Maiorana, PC

(57) ABSTRACT

A method for branch metric calculation in a plurality of communications standards is disclosed. The method generally includes steps (A) to (C). Step (A) may calculate a plurality of sum values by adding a plurality of first values related to a plurality of information bits, a plurality of second values related to the information bits and a plurality of third values related to a plurality of parity bits. Step (B) may generate a plurality of permutated values by permutating the sum values based on a configuration signal. The configuration signal generally identifies a current one of the communications standards. Step (C) may generate a plurality of branch metrics values by adding pairs of the permutated values.

20 Claims, 10 Drawing Sheets

BRANCH METRICS CALCULATION FOR MULTIPLE COMMUNICATIONS STANDARDS

This application claims the benefit of Russian Application No. 2010148337, filed Nov. 29, 2010 and is hereby incorporated by reference in its entirety.

FIELD OF THE INVENTION

The present invention relates to trellis decoding generally and, more particularly, to a method and/or apparatus for implementing a branch metrics calculation for multiple communications standards.

BACKGROUND OF THE INVENTION

Turbo and convolutional codes are widely used forward error correction codes. Turbo codes were proposed by Berrou and Glavieux in 1993 and have been adopted in many communication standards such as Wideband-CDMA (WCDMA), Code Division Multiple Access 2000 (CDMA2000), Worldwide Interoperability for Microwave Access (WiMAX), Long Term Evolution (LTE) and Digital Video Broadcasting-Return Channel via Satellite (DVB-RCS). The codes allow near optimal decoding with excellent performance approaching the Shannon limit for Additive White Gaussian Noise (AWGN) channels.

Conventional radix-4 decoding supports duo-binary turbo codes (adopted in WiMAX and DVB-RCS) and single-binary convolutional and turbo codes. Moreover, support for the duo-binary turbo codes implies two times faster decoding techniques than for single-binary codes at the expense of some additional circuit area. A problem with radix-4 decoding is a bottleneck in calculating the state metrics. A State Metrics Calculator (SMC) circuit performing add-compare-select operations experiences a bottleneck when implementing high-speed convolutional and turbo decoders. State metrics calculations cannot be easily pipelined because the state metrics computed at time instance t are used for computing the state metrics at time instance t+1. Therefore, radix-4 decoding increases the importance of the path through the SMC circuit. Another problem with radix-4 decoding is related with decoder universality (i.e., the ability to support many different convolutional and turbo codes in the same hardware). Since the trellises for the various codes are different, additional configuration logic (i.e., multiplexers) is commonly used in the SMC circuit to handle all of the trellises in a single design.

SUMMARY OF THE INVENTION

The present invention concerns a method for branch metric calculation in a plurality of communications standards. The method generally includes steps (A) to (C). Step (A) may calculate a plurality of sum values by adding a plurality of first values related to a plurality of information bits, a plurality of second values related to the information bits and a plurality of third values related to a plurality of parity bits. Step (B) may generate a plurality of permutated values by permutating the sum values based on a configuration signal. The configuration signal generally identifies a current one of the communications standards. Step (C) may generate a plurality of branch metrics values by adding pairs of the permutated values.

The objects, features and advantages of the present invention include providing a method and/or apparatus for implementing a branch metrics calculation for multiple communications standards that may (i) implement a configurable branch metrics calculator, (ii) avoid multiplexers in state metrics calculations, (iii) support multiple communications standards, (iv) implement a universal switch module and/or (v) occupy a low silicon area.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Some embodiments of the present invention generally concern a reconfigurable chip (or die) for decoding an input signal in accordance with two or more wireless communications standards. The wireless communications standards may include, but are not limited to, a Long Term Evolution (LTE) standard (3GPP Release 8), an Institute of Electrical and Electronics Engineering (IEEE) 802.16 standard (WiMAX), a Wideband-CDMA/High Speed Packet Access (WCDMA/HSPA) standard (3GPP Release 7) and a CDMA-2000/Ultra Mobile Broadband (UMB) standard (3GPP2). Other wired and/or wireless communications standards may be implemented to meet the criteria of a particular application.

Some embodiments of the present invention may relate to decoder universality where many different convolutional codes and turbo codes are supported in the same hardware. Instead of adding configuration logic to a State Metric Calculation (SMC) circuit, configuration logic may be added to a Branch Metric Calculation (BMC) circuit. The BMC circuit generally computes branch metrics and may be used with the SMC circuit in decoding. The BMC circuit may be readily pipelined. Hence, adding configuration logic to BMC circuit generally does not lead to a bottleneck. Moreover, implementations of some embodiments may utilize low silicon area and may be easily configured. Any rate (e.g., 1/3 rate) convolutional encoder with a given constraint length (e.g., up to 8) may be supported. Furthermore, a simple universal permutation 4×4-network may be used in the configuration logic to reduce the overall layout area.

The universal BMC circuit design generally includes a radix-4 universal branch metric calculation. The universal branch metric calculation may be used in both (i) Maximum-Logarithmic-MAP (Maximum A Posteriori) decoding techniques of turbo codes and (ii) Viterbi decoding techniques of convolutional codes. The universal branch metric calculations may also be used for high-speed and low-area implementations of multi-standard radix-4 decoders supporting turbo and convolutional decoding for most existing wireless standards, such as W-CDMA, CDMA2000, WiMAX and LTE.

Figure 1:
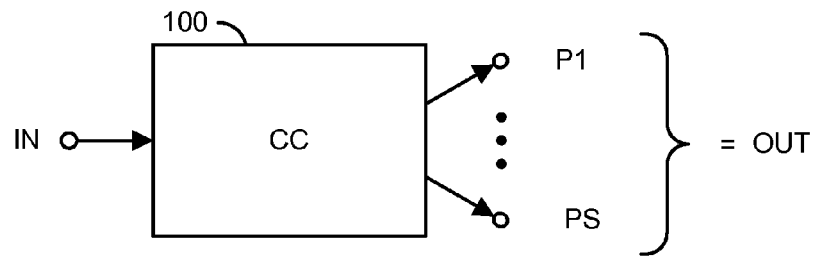
FIG. 1 is a block diagram of a convolutional rate 1/s encoder.

Referring to FIG. 1, a block diagram of an apparatus 100 is shown. The apparatus (or device or circuit) 100 may implement a convolutional rate 1/s encoder. A signal (e.g., IN) may be received by the apparatus 100. A signal (e.g., OUT) may be generated by the apparatus 100 in response to the signal IN. The apparatus 100 may represent one or more modules and/or blocks that may be implemented as hardware, firmware, software, a combination of hardware, firmware and/or software, or other implementations.

The signal IN may convey an information word received by the apparatus 100. The information word "d" (e.g., data to be transmitted) may be described by formula 1 as follows:

$$d=(d_1, \ldots, d_k) \in \{0,1\}^k \quad (1)$$

where each $d_i \in \{0,1\}$ may be an information bit and parameter "k" may be an information word length. The apparatus 100 generally adds redundancy to the information word d and produces a codeword "c" in the signal OUT. Codeword c is generally illustrated by formula 2 as follows:

$$c=(c_1, \ldots, c_n) \in \{0,1\}^n \quad (2)$$

where "n" is the codeword length and R=k/n may be a code rate.

For convolutional rate 1/s, the apparatus 100 may be defined by a generator matrix G. Generator matrix G is generally shown in formula 3 as follows:

$$G=[g^{(1)}(D), \ldots, g^{(s)}(D)] \quad (3)$$

where each g(i)(D) (e.g., formula 4)

$$g^{(i)}(D) = \frac{a^{(i)}(D)}{b^{(i)}(D)} \in F_2(D) \quad (4)$$

may be a rational function in variable D over the binary field $F_2=\{0,1\}$. The elements $a^{(i)}(D), b^{(i)}(D) \in F_2(D)$ may be polynomials in D with coefficients in $F_2$ and $a^{(i)}(0)=b^{(i)}(0)=1$. When the apparatus 100 receives the signal IN carrying an infinite binary sequence (e.g., formula 5)

$$d=d_1, d_2, \ldots, d_i, \ldots \quad (5)$$

the signal IN may be interpreted as a formal power series per formula 6 as follows:

$$d(D)=d_1+d_2D+\ldots+d_iD^{i-1}+\ldots \quad (6)$$

The apparatus 100 may generate multiple signals (e.g., P1 to PS). A combination of the signals P1 to PS may form the signal OUT. Each signal P1 to PS may carry a sequence (e.g., p(1) to p(s)) as shown in formulae 7 set as follows:

$$p^{(1)} = p_1^{(1)}, p_2^{(1)}, \ldots, p_i^{(1)}, \ldots$$
$$\vdots \quad (7)$$
$$p^{(s)} = p_1^{(s)}, p_2^{(s)}, \ldots, p_i^{(s)}, \ldots$$

The sequences may be considered as formal power series and calculated as shown in formulae set 8 as follows:

$$p^{(1)}(D) = t_1(D) \cdot d(D),$$
$$\vdots \quad (8)$$
$$p^{(s)}(D) = t_s(D) \cdot d(D),$$

The resulting codeword c may be represented by formula 9 as follows:

$$c=(p_1^{(1)}, \ldots, p_1^{(s)}, p_2^{(1)}, \ldots, p_2^{(s)}, \ldots, p_k^{(1)}, \ldots, p_k^{(s)}) \quad (9)$$

where p(j) (e.g., formula 10)

$$p^{(j)}=(p_1^{(j)}, \ldots, p_k^{(j)}) \quad (10)$$

may be the j-th element created by the convolutional encoding. The word p(j) may be referred to as a parity word.

In the case of convolutional codes (CC) generally used in wireless standards, the channel encoding may not be systematic (e.g., the encoding may have a polynomial transfer matrix). In the case of convolutional turbo codes (CTC), the encoding may be systematic (e.g., the information word d may be a part of the codeword c).

Figure 2:
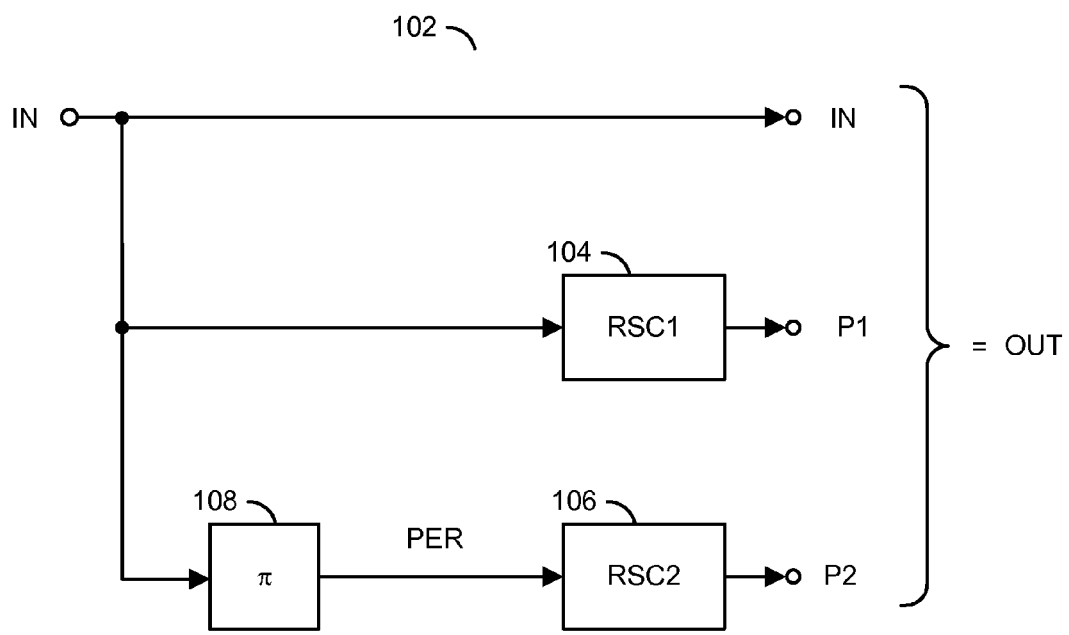
FIG. 2 is a block diagram of a convolutional turbo rate 1/3 encoder.

Referring to FIG. 2, a block diagram of an apparatus 102 is shown. The apparatus (or device or circuit) 102 may implement a convolutional turbo rate 1/3 encoder. The apparatus 102 generally comprises a circuit (or module) 104, a circuit (or module) 106 and a circuit (or module) 108. The signal. IN may be received by the circuits 104 and 108. A signal (e.g., PER) may be generated by the circuit 108 and received by the circuit 106. The circuit 104 may generate the signal P1. The circuit 106 may generate the signal P2. A combination of the signals IN, P1 and P2 may establish the signal OUT. The circuits 104 to 108 may represent modules and/or blocks that may be implemented as hardware, firmware, software, a combination of hardware, firmware and/or software, or other implementations.

The circuit 104 may implement a Recursive Systematic Convolutional (RSC) encoder. The circuit 104 is generally operational to encode the information word d to generate the parity word p(1). The information word d may be received in the signal IN. The parity word p(1) may be presented in the signal P1. The encoding may be a recursive systematic convolutional encoding.

The circuit 106 may implement another RSC encoder. The circuit 106 is generally operational to encode a permuted word π(d) (e.g., formula 11)

$$\pi(d)=(d_{\pi(1)}, \ldots, d_{\pi(k)}) \quad (11)$$

to generate the parity word p(2). The permuted word π(d) may be received in the signal PER from the circuit 108. The parity word p(2) may be presented in the signal P2. The encoding may also be a recursive systematic convolutional encoding. The circuit 106 may be a duplicate of the circuit 104 and perform the same encoding technique.

The circuit 108 may implement an interleaver circuit. The circuit 108 is generally operational to generated the permuted word π(d) by permuting the information word d. The information word d may be received in the signal IN. The permuted word π(d) may be presented to the circuit 106 in the signal PER.

Each standard LTE, W-CDMA/HSPA and WiMAX may include rate ⅓ turbo codes. In the WiMAX standard, the codeword c may be given by formula 12 as follows:

$$c=(d_1,p_1^{(1)},p_1^{(2)},\ldots,d_k,p_k^{(1)},p_k^{(2)}) \quad (12)$$

where n=3k and tail-biting may be utilized. In the LTE standard and the W-CDMA/HSPA standard, the codeword c is generally illustrated by formula 13 as follows:

$$c=(d_1,p_1^{(1)},p_1^{(2)},\ldots,d_k,p_k^{(1)},p_k^{(2)},t_1,\ldots,t_{12}) \quad (13)$$

where n=3k+12 and the final several bits (e.g., 12 bits t1, ..., t12) may be used for trellis termination. The trellis termination generally forces the apparatus 102 to an initial zero state. In the case of trellis termination, the actual code rate k/(3k+12) may be a little smaller than the rate ⅓.

In the above cases, the parity word p(1) in the signal P1 may convey the parity bits word obtained for an unpermuted information word d generated by the circuit 104. The parity word p(2) may be obtained for the permuted word π(d) generated by the circuit 108. An operation n may be a permutation on a set {1, 2, ..., k} specified by an interleaver table of the standard.

A decoder is generally a device that receives vector of quantized Logarithm of Likelihood Ratios (LLR's) for each bit in the codeword c as received from a modulator. The modulator operation may be denoted by L(c). The decoder generally attempts to reconstruct the transmitted information word d. A decision of the decoder may be denoted by a $\hat{d}$ per formula 14 as follows:

$$\hat{d}=(\hat{d}_1,\ldots,\hat{d}_k)\in\{0,1\}^k \quad (14)$$

Each value $\hat{d}_i$ may be called a hard decision for information bit $\hat{d}_i$, where i=1 to k. Sometimes (e.g., in turbo equalization) the decoder may also generate soft decisions for the information and the parity bits. Such decoders may be called soft-input soft-output (SISO) decoders.

Figure 3:
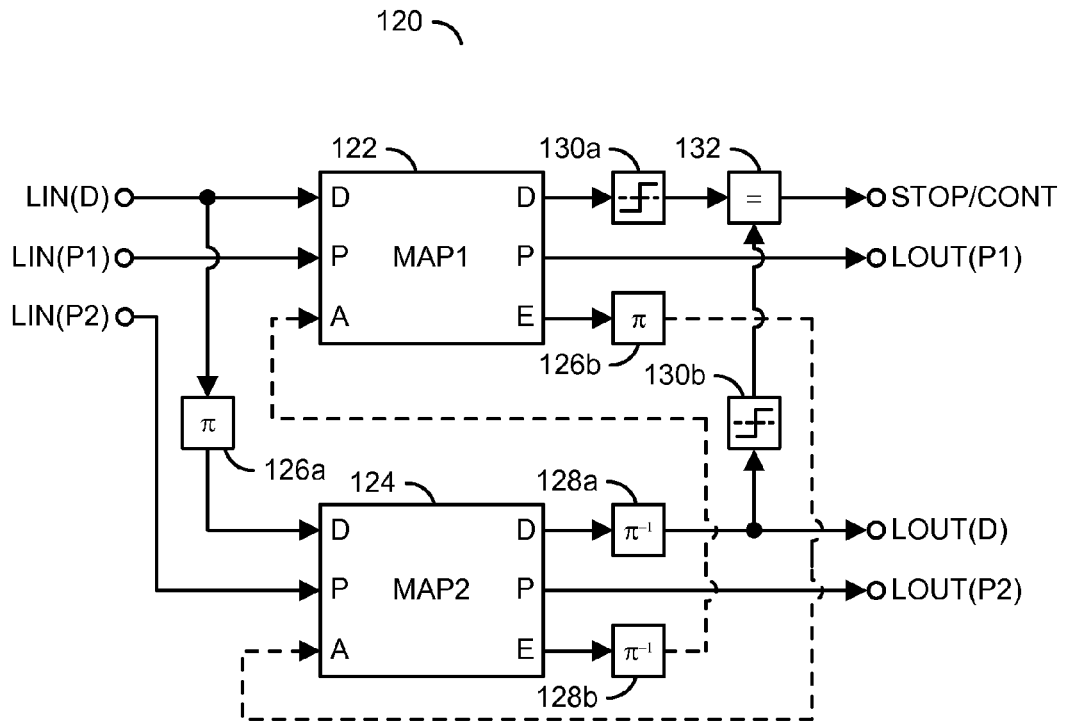
FIG. 3 is a block diagram of a Soft-In-Soft-Out decoder.

Referring to FIG. 3, a block diagram of an apparatus 120 is shown. The apparatus (or device or circuit) 120 may implement a Soft-In-Soft-Out (SISO) decoder for convolutional turbo rate ⅓ codes with a Hard Decision Aided (HDA) early stopping criteria. The apparatus 120 generally comprises a circuit (or module) 122, a circuit (or module) 124, multiple interleaver circuits (or modules) 126a to 126b, multiple inverse interleaver circuits (or modules) 128a to 128b, multiple slicer circuits (or modules) 130a to 130b and a compare circuit (or module) 132. The circuits 122 to 132 may represent modules and/or blocks that may be implemented as hardware, firmware, software, a combination of hardware, firmware and/or software, or other implementations.

A signal (e.g., LIN(D)) may be received by the circuits 122, 124 and 126a. A signal (e.g., LIN(P1)) may be received by the circuit 122. A signal (e.g., LIN(P2)) may be received by the circuit 124. The circuit 128a may generate a signal (e.g., LOUT(D)). A signal (e.g., LOUT(P1)) may be generated by the circuit 122. The circuit 124 may generate a signal (e.g., LOUT(P2)). A signal (e.g., STOP/CONT) may be generated by the circuit 132.

Turbo decoding may perform a number of computation cycles called full iterations. Each full iteration may include two half iterations. The turbo decoding process generally runs until either a maximum full iteration number (e.g., typical value is 8) is reached or one or more early stopping criterion is satisfied.

On each half iteration, the circuits 122 and 124 generally perform a Maximum A Posteriori (MAP) process explained below for one of the constitutive convolutional encoders RCS1 and RSC2 of a turbo encoder (see FIG. 2). For each full iteration on the initial half iteration, the circuits 122 and 124 generally perform MAP decoding for RSC1 and on the second half iteration for RSC2. Extrinsic LLR's obtained in the circuits 122 and 124 may be permuted by the circuits 128b/126b and exchanged between half iterations. After each half iteration, the circuit 132 may compare hard decisions from the circuit 122 with permuted hard decisions from the circuit 124. If the hard decisions match each other, the circuit 120 may stop decoding and assert the signal STOP/CONT in a stop condition. Otherwise, the signal STOP/CONT may be asserted in a continue condition. The matching hard decision criterion may be an early stopping criterion called hard-decision aided (HDA) criterion.

Figure 4:
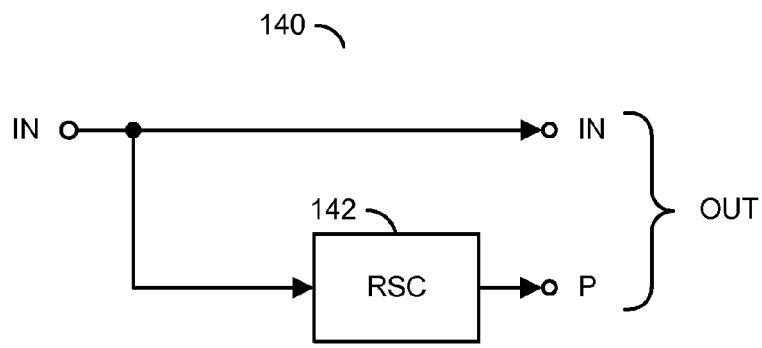
FIG. 4 is a block diagram of a convolutional rate 1/2 encoder.

Referring to FIG. 4, a block diagram of an apparatus 140 is shown. The apparatus (or device or circuit) 140 may implement a convolutional rate ½ encoder. The apparatus 140 generally comprises a circuit (or module) 142. The circuit 140 may represent one or more modules and/or blocks that may be implemented as hardware, firmware, software, a combination of hardware, firmware and/or software, or other implementations.

The signal IN may be received by the circuit 142. The circuit 142 may generate a signal (e.g., P). The signal OUT may be a combination of the signals IN and a signal (e.g., P).

The circuit 140 may be operational to generate a systematic convolutional rate ½ code. The circuit 142 may implement another RSC circuit, similar to circuits 104 and 106. The circuit 142 may be operational to generate a parity word p in the signal P in response to the information word d received in the signal IN.

Figure 5:
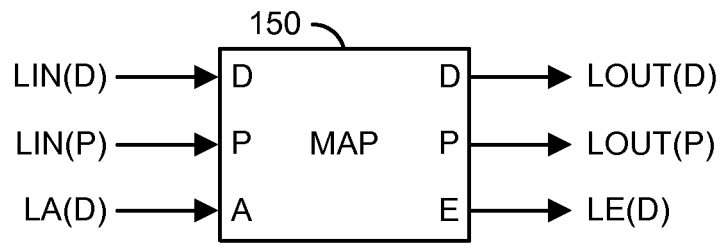
FIG. 5 is a block diagram of a Maximum A Posteriori decoder.

Referring to FIG. 5, a block diagram of an apparatus 150 is shown. The apparatus (or device or circuit) 150 may implement a MAP decoder for systematic convolutional rate ½ codes. The circuit 150 may represent one or more modules and/or blocks that may be implemented as hardware, firmware, software, a combination of hardware, firmware and/or software, or other implementations.

A signal (e.g., LIN(D)) may be received by the circuit 150 from a modulator. A signal (e.g., LIN(P)) may also be received by the circuit 150 from the modulator. Another signal (e.g., LA(D)) may be sent from the modulator to the circuit 150. The circuit 150 may generate a signal (e.g., LOUT(D)). A signal (e.g., LOUT(P)) may also be generated by the circuit 150. A signal (e.g., LE(D)) may be generated by the circuit 150.

The circuit 150 may implement a MAP decoder circuit. A part of the turbo decoding process is the MAP decoding process. The MAP decoding process may be applied for any convolutional code. In the case of rate ⅓ turbo code, the MAP decoding may be applied for systematic convolutional rate ½ codes only. In some embodiments, the circuit 150 may be operational to perform a Max-Log-MAP decoding process. Other MAP decoding processes may be implemented to meet the criteria of a particular application.

The signal LIN(D) may carry an LLR soft decision from the modulator for the information bits d. The signal LIN(P) may convey an LLR soft decision for the parity bits p. The signal LA(D) generally carries LLR soft decision a priori probability data for the information bits d. LLR soft decisions of MAP decoder (circuit 150) may be carried in the signal LOUT(D) for the information bits d and the signal LOUT(P) for the parity bits p. Extrinsic LLR data used in turbo decoding between half iterations may be presented in the signal LE(D).

Figure 6:
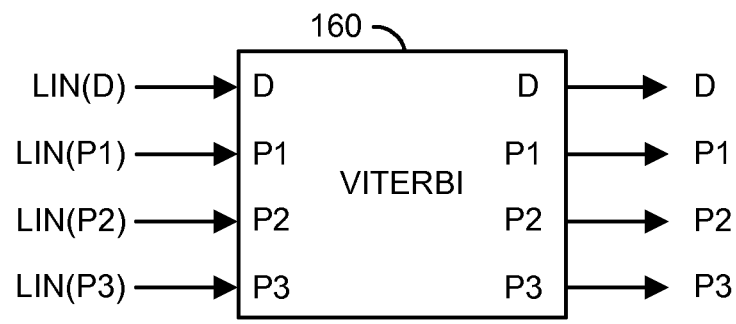
FIG. 6 is a block diagram of a Viterbi decoder.

Referring to FIG. 6, a block diagram of an apparatus 160 is shown. The apparatus (or device or circuit) 160 may implement a Viterbi decoder for convolutional rate ⅓ codes. The circuit 160 may represent one or more modules and/or blocks that may be implemented as hardware, firmware, software, a combination of hardware, firmware and/or software, or other implementations.

The signal LIN(D) may be received by the circuit 160 from a modulator. Multiple signals for parity (e.g., LIN(P1), LIN(P2) and LIN(P3)) may also be received by the circuit 160 from the modulator. The circuit 160 may generate a signal (e.g., D). A signal (e.g., P1) may also be generated by the circuit 160. A signal (e.g., P2) may be generated by the circuit 160. The circuit 160 may also generate a signal (e.g., P3).

The circuit 160 may implement a Viterbi decoder circuit. The circuit 160 is generally operational to decode according to the Viterbi decoding process. The Viterbi process is generally used for decoding of convolutional codes. The same hardware may be utilized for performing state metric recursions in both the Viterbi process and the MAP decoding process (e.g., circuit 150). The circuit 160 generally uses LLR soft decisions from the modulator for information bits d and parity bits p as received in the signals LIN(D), LIN(P1), LIN(P2) and LIN(P3). The result of Viterbi decoder work may be the hard decisions for the reconstructed information bits $\hat{d}$ and the reconstructed parity bits $\hat{p}$. The hard decisions may be carried in the signals D, P1, P2 and P3 respectively.

Figure 7:
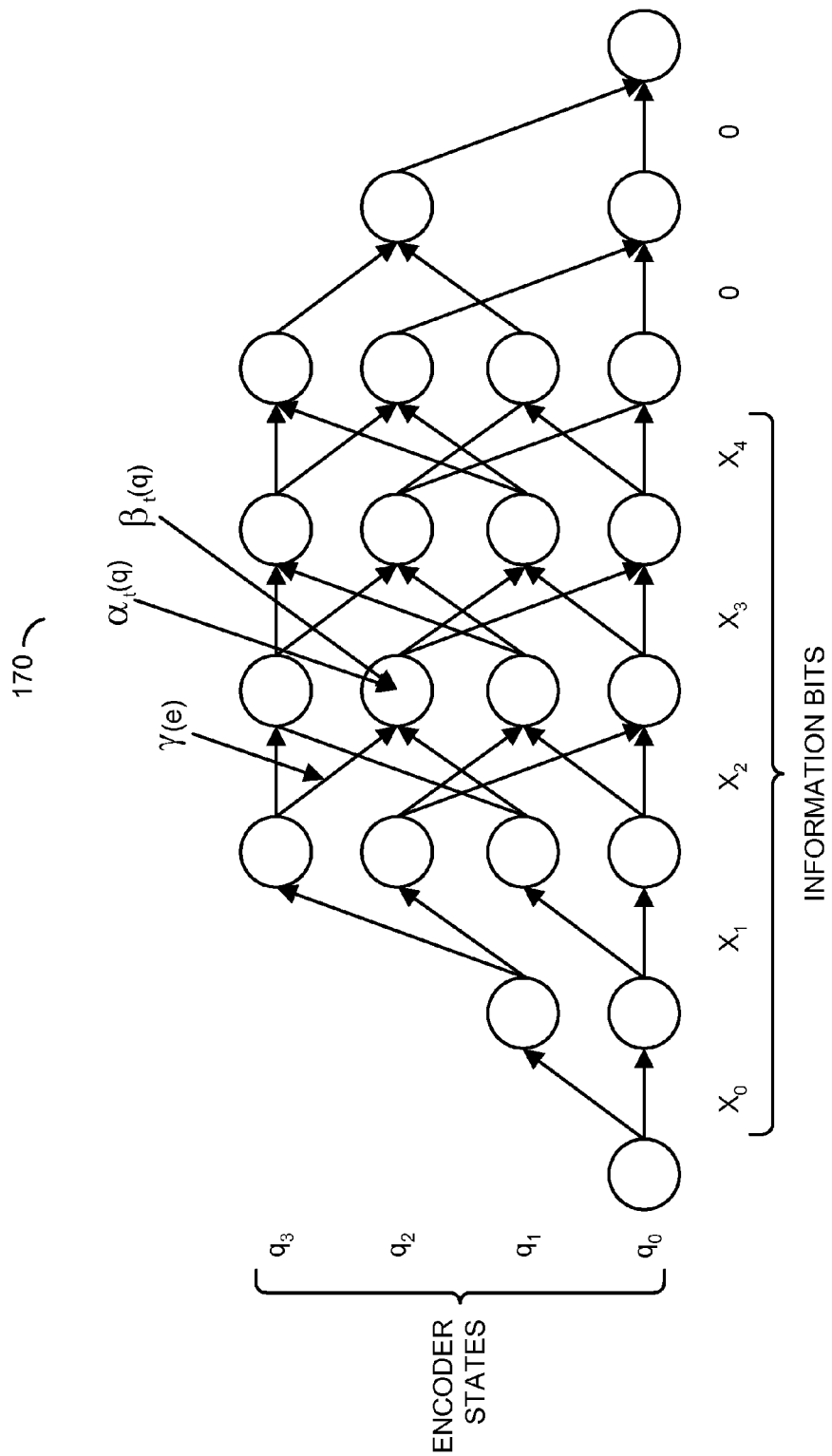
FIG. 7 is a diagram of an example trellis for a convolutional code.

Referring to FIG. 7, a diagram of an example trellis 170 for a convolutional code is shown. Both the Max-Log-MAP decoding process and the Viterbi decoding process generally use a graphical representation of the code called a code trellis. The code trellis generally describes the convolutional encoder work in a time scale. If a codeword length is "n", the trellis 170 may be a graph with n+1 groups of vertexes $V_0, V_1, \ldots, V_n$, called levels. Each level Vi generally corresponds to a time instance t=0, 1, ..., n and may include all possible encoder states at time instance t. Therefore, vertex $V_0$ may contain only an initial encoder state q0, vertex $V_1$ may contain all the states of encoder that are reachable in one step from q0, and so on. Given an edge e from a state q∈Vi labeled with x/y to a state q'∈Vi, if an encoder at the state q responds to an input x by moving to state q' and outputs y. The edge e from the state q to the state q' in the trellis 170 may be denoted by $$q \xrightarrow{e} q'.$$

Figure 8:
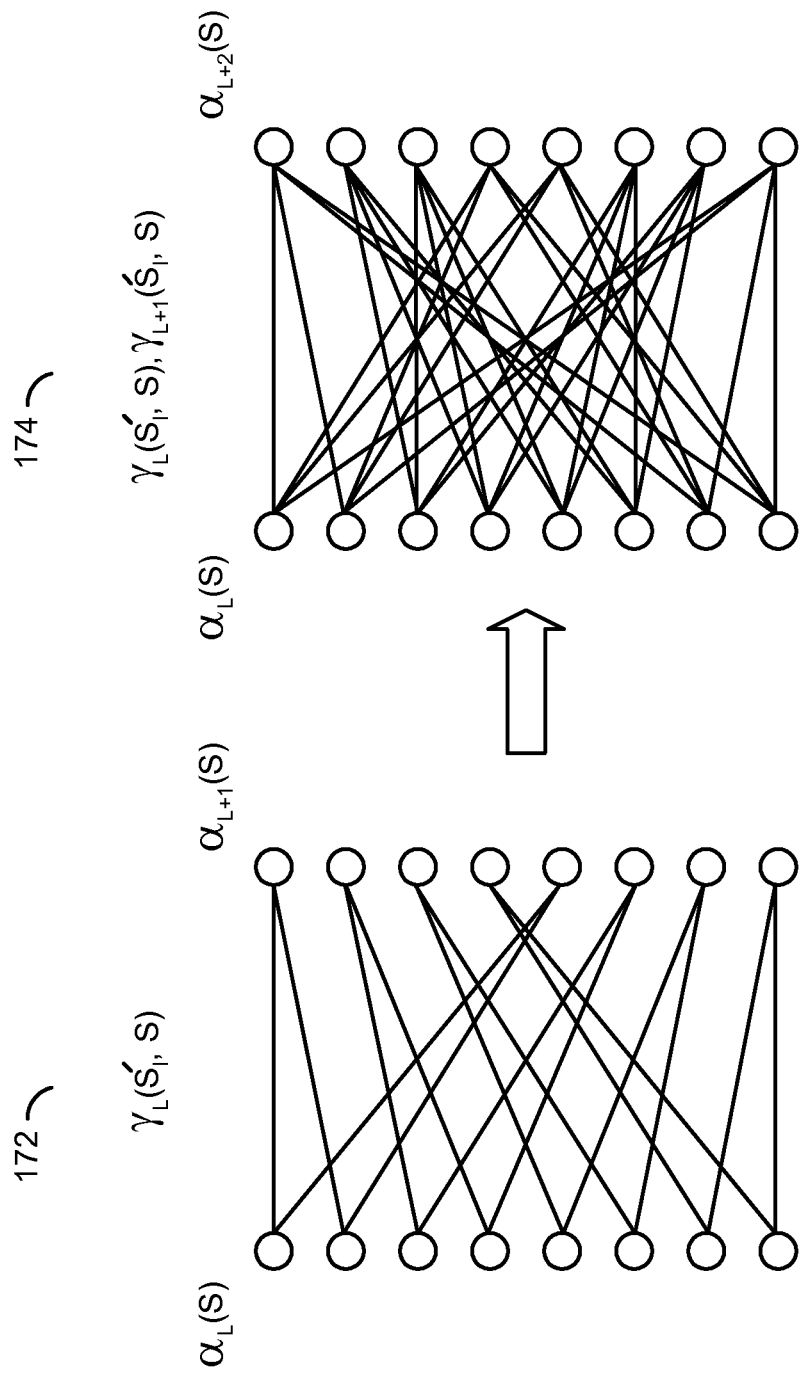
FIG. 8 is a diagram of a radix-2 trellis and a radix-4 trellis.

Referring to FIG. 8, a diagram of an example of a radix-2 trellis 172 and a radix-4 trellis 174 is shown. To support WiMAX standard a radix-4 decoding process may be implemented. In some embodiments, the radix-4 trellis 174 may represent the work of encoder with double speed. A radix-4 variant of the trellis 174 generally operates two times faster than the ordinary radix-2 trellis 172.

Both the Max-Log-MAP decoding process for turbo decoding and the Viterbi decoding process for convolutional decoding may be based on the same procedure. The procedure generally computes (i) for each edge e in the code trellis a quantity γ(e) called a branch metric and (ii) for each vertex q in each level Vi of the code trellis a number of quantities called state metrics: $\alpha_t(q)$ and $\beta_t(q)$ in Max-Log-MAP decoding; and $\alpha_t(q)$ in Viterbi decoding. All the quantities may be in the domain $R \cup \{\infty\}$, where R may be the set of real numbers. In hardware implementations of a decoder, integer arithmetic may be used instead of real numbers.

In the case of Max-Log-MAP decoding, the computation for trellis of length n may be as illustrated in formulae 15 to 18 as follows:

$$\alpha_0(q_0) = 0, \text{ and } \alpha_0(q) = -\infty \text{ for all encoder states } q \neq q_0 \quad (15)$$

$$\alpha_{t+1}(q') = \max_{\substack{e \\ q \xrightarrow{e} q'}} \{\alpha_t(q) + \gamma(e)\} \text{ for all } t = 0, 1, \ldots, n \quad (16)$$

$$\beta_0(q) = 0 \text{ for all encoder states } q \quad (17)$$

$$\beta_t(q) = \max_{\substack{e \\ q \xrightarrow{e} q'}} \{\beta_{t+1}(q') + \gamma(e)\} \text{ for all } t = 0, 1, \ldots, n, \quad (18)$$

where q0 may be an initial state of the encoder. In the case of Viterbi decoding, a recursion for α state metrics may be implemented. Furthermore, for each computed $\alpha_{t+1}$(q'), the edge e should be remembered such that $\alpha_t$(q)+γ(e) are maximal.

The branch metrics for edge e in a radix-4 Max-Log-MAP decoding for turbo codes is generally computed by formula 19 as follows:

$$\gamma(e) = (-1)^{x_1}(X_1 + A_1) + (-1)^{x_2}(X_2 + A_2) + (-1)^{z_1}Z_1 + (-1)^{z_1}Z_1 \quad (19)$$

where x1 and x2 may be information bits, and z1 and z2 may be parity bits associated with the edge e. Branch metrics calculations may include (i) a priori soft LLR values $A_1, A_2$ for information bits x1,x2 from the signal LA(D), (ii) soft LLR values $X_1, X_2$ for information bits x1,x2 from the signal LIN(D) and (iii) soft LLR values $Z_1, Z_2$ for parity bits z1,z2 from the signal LIN(P).

Branch metrics for edge e in radix-4 Viterbi decoding process for rate ⅓ convolutional code may be computed by formula 20 as follows:

$$\gamma(e) = \sum_{i=1}^{s} \left((-1)^{z_1^{(i)}} Z_1^{(i)} + (-1)^{z_2^{(i)}} Z_2^{(i)}\right) \quad (20)$$

Parity bits z1(i),z2(i) may be associated with the edge e and soft LLR values $Z_1$(i),$Z_2$(i) from the signal LIN(P) may be used (see for the case s=3). When all of the state and branch metrics are computed, the decoders generally produce soft LLR decisions in the signals LOUT(D), LOUT(P) for the information bits and the parity bits respectively and extrinsic LLR's in the signal LE(D) in the Max-Log-MAP decoding process (e.g., circuit 150) and hard decisions in the signals D, P(1), ..., P(s) in the Viterbi decoding process (e.g., circuit 160).

Figure 9:
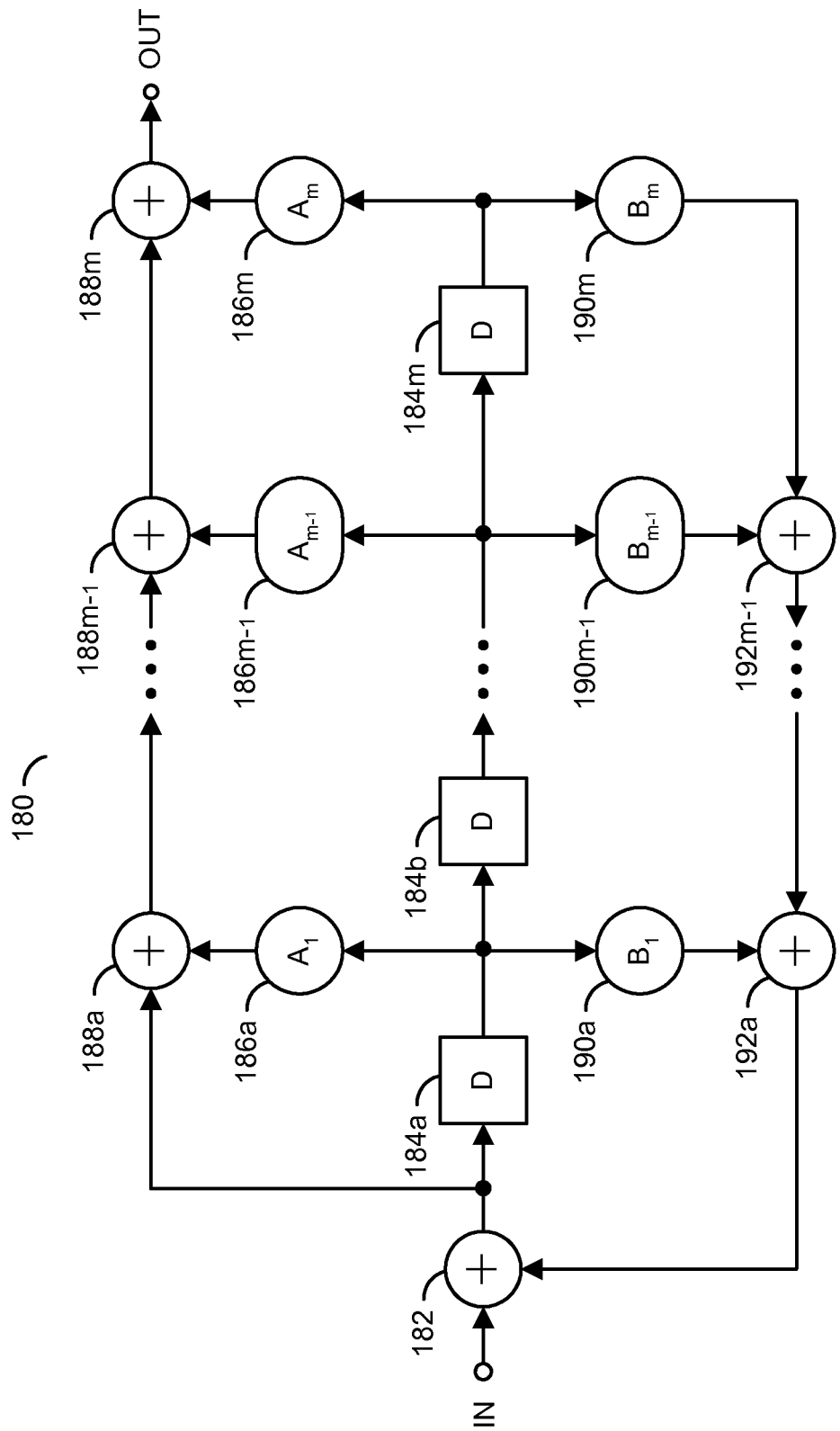
FIG. 9 is a block diagram of a rate 1 convolutional encoder.

Referring to FIG. 9, a block diagram of an apparatus 180 is shown. The apparatus (or device or circuit) 180 may implement a rate 1 convolutional encoder. The apparatus 180 generally represents a scheme for an RSC encoder. The apparatus 180 generally comprises a circuit (or module) 182, multiple circuits (or modules) 184a to 184m, multiple circuits (or modules) 186a to 186m, multiple circuits (or module) 188a to 188m, multiple circuits (or modules) 190a-190m and multiple circuits (or modules) 192a to 192m-1. The circuit 182 may receive the signal IN. The circuit 188m may generate and present the signal OUT. The circuits 182 to 192m-1 may represent modules and/or blocks that may be implemented as hardware, firmware, software, a combination of hardware, firmware and/or software, or other implementations.

The circuit 182 may present a signal to the circuit 184a and the circuit 188a. Each circuit 184a to 184m-1 may present a signal to the next respective circuit 184b to 184m, a respective circuit 186a to 186m-1 and a respective circuit 190a to 190m-1. The circuit 184m may present a signal to the circuits 186m and 190m. Each circuit 186a to 186m may present a signal to a respective circuit 188a to 188m. Each circuit 188a to 188m-1 may present a signal to a respective next circuit 188b to 188m. Each circuit 190a to 190m-1 may present a signal to a respective circuit 192a to 192m-1. The circuit 190m may also present a signal to the circuit 192m-1. Each circuit 192b to 192m-1 may present a signal to a respective previous circuit 192a to 192m-2. The circuit 192a may present a signal back to the circuit 182.

Each circuit 182, 188a to 188m and 192a to 192m-1 may implement an adder circuit. The circuits 182, 188a to 188m and 192a to 192m-1 are generally operational to generate a sum at an output port of two values received at the respective input ports.

Each circuit 184a to 184m may implement a delay circuit (e.g., register). The circuit 184a-184m may be operational to buffer a received value for a single clock cycle.

Each circuit 186a to 186m may implement a transfer circuit. The circuit 186a to 186m may be operational to transfer an input value to an output value per a respective polynomial (e.g., A1 to Am).

Each circuit 190a to 190m may implement another transfer circuit. The circuit 190a to 190m may be operational to transfer an input value to an output value per a respective polynomial (e.g., B1 to Bm). A number of additional rates may be easily obtained by applying puncturing. Puncturing generally deletes some of the parity symbols according to a puncturing scheme defined in each standard.

Trellises of different convolutional codes generally have similar structure. The similarities may enable a reduction in the complexity of a universal trellis decoder suitable for working with many trellises. Consider a rate 1 convolutional encoder where a state transition of any rate 1/s encoder is the same. An encoder state q may be defined by formula 21 as follows:

$$q(t)=[q_1(t),\ldots,q_m(t)]\epsilon F_2^m \qquad (21)$$

where $x(t)\epsilon F_2$, and $y(t)\epsilon F_2$ are an input and output at the moment $t=0, 1, \ldots$. Choosing an initial state $q(0)$ of the encoder per formula 22 as follows:

$$q^{(0)}=[q_1^{(0)},\ldots,q_{m(0)}]\epsilon F_2^m \qquad (22)$$

the work of the encoder may be described by formula 23 as follows:

$$\begin{cases} q_1(0) &= q_1^{(0)}, \\ &\vdots \\ q_m(0) &= q_m^{(0)}, \\ q_1(t+1) &= b_1 q_1(t)+\ldots+b_m q_m(t)+x(t), \\ q_2(t+1) &= q_1(t), \\ &\vdots \\ q_m(t+1) &= q_{m-1}(t), \\ y(t) &= a_0 x(t)+a_1 q_1(t)+\ldots+a_m q_m(t) \end{cases} \qquad (23)$$

and in a compact form by formula 24 as follows:

$$\begin{cases} q(0) &= q^{(0)}, \\ q(t+1) &= \delta(q(t),x(t)), \\ y(t) &= \lambda(q(t),x(t)), \\ t &= 0,1,2,\ldots \end{cases} \qquad (24)$$

A transition function may be described by formula 25 as follows:

$$\delta: F_2^m \times F_2 \to F_2^m \qquad (25)$$

An output function of finite automaton that corresponds to the encoder may be given by formula 26 as follows:

$$\lambda: F_2^m \times F_2 \to F_2 \qquad (26)$$

Figure 10:
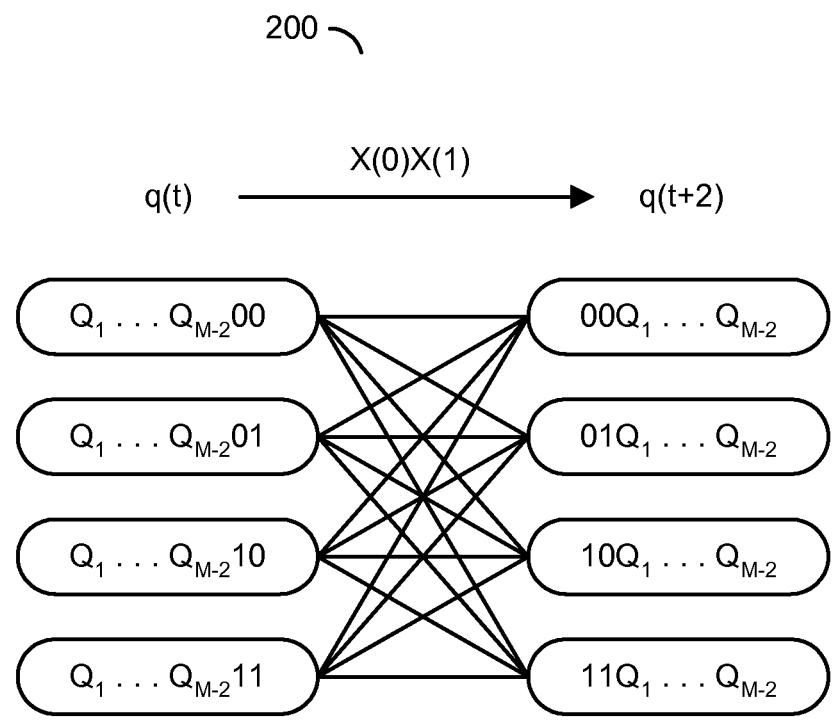
FIG. 10 is a diagram of a transition graph.

Referring to FIG. 10, a diagram of a transition graph 200 for a radix-4 convolutional encoder is shown. The transition graph 200 generally illustrates possible transitions from a state q(t) to a state q(t+2).

Returning to formula 23, if bm=1, the automata may be seen as a permutation automata. In a permutation automata, each input $x \epsilon F_2$ may permute the set of states $F_2$. If a0=1, the formula 27 as follows:

$$y(t)=a_0 x(t)+a_1 q_1(t)+\ldots+a_m q_m(t) \qquad (27)$$

generally shows that if q(t) is fixed then y(t) is either x(t) or $\bar{x}(t)$. In such a case, the input/output function of the automaton may be a bijection. In a bijection, for any two different input words and fixed initial state the corresponding outputs may be different. From the above, an encoder generally satisfies the following condition: for any two different input words of length no more than m, the different input words may map an initial state into different states. Notice that all of the turbo encoders from the WiMAX, LTE and WCDMA communications standards may satisfy the following two conditions (bm=1 and a0=1). Convolutional encoders generally do not meet the bm=1 condition. Consider a set of four states as illustrated in formula 28 as follows:

$$\langle q_1 \ldots q_{m-2}** \rangle := \{q_1 \ldots q_{m-2}00, q_1 \ldots q_{m-2}01, q_1 \ldots q_{m-2}10, q_1 \ldots q_{m-2}11\} \qquad (28)$$

By applying a set of input words {00,01,10,11}, a set described by formula 29 may be obtained as follows:

$$\langle **q_1 \ldots q_{m-2} \rangle := \{00q_1 \ldots q_{m-2}, 01q_1 \ldots q_{m-2}, 10q_1 \ldots q_{m-2}, 11q_1 \ldots q_{m-2}\} \qquad (29)$$

Moreover, the corresponding transition graph 200 may be a full bipartite graph $K_{4,4}$.

Figure 11:
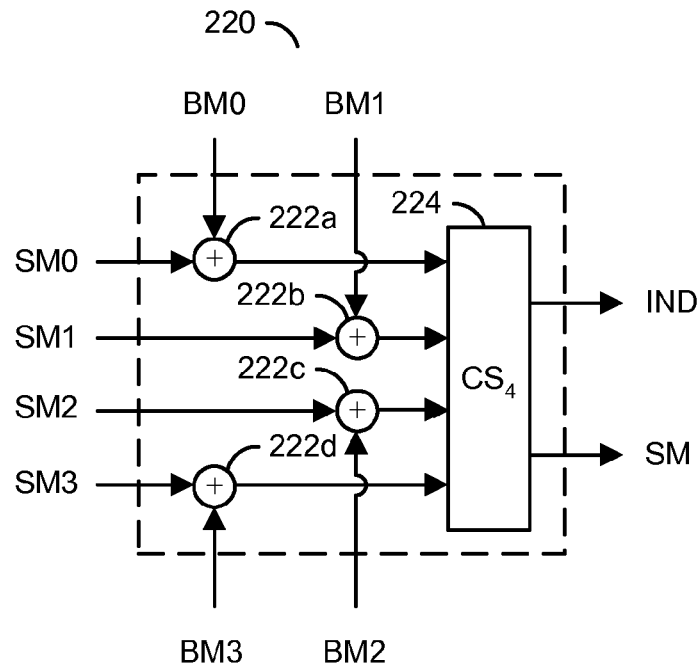
FIG. 11 is a block diagram of an Add-Compare-Select circuit.

Referring to FIG. 11, a block diagram of an apparatus 220 is shown. The apparatus (or device or circuit) 220 may implement an Add-Compare-Select (ACS) circuit for state metrics calculations. The circuit 220 generally comprises multiple adders (or modules) 222a to 222d and a circuit (or module) 224. The circuits 222a to 224 may represent one or more modules and/or blocks that may be implemented as hardware, firmware, software, a combination of hardware, firmware and/or software, or other implementations.

A signal (e.g., SM0) and a signal (e.g., BM0) may be received by the circuit 222a. The circuit 222b may receive a signal (e.g., SM1) and a signal (e.g., BM1). A signal (e.g., SM2) and a signal (e.g., BM2) may be received by the circuit 222c. The circuit 222d may receive a signal (e.g., SM3) and a signal (e.g., BM3). The circuit 224 may receive the sums from the circuits 222a to 222d. A signal (e.g., IND) may be generated by the circuit 224. The circuit 224 may also generate a signal (e.g., SM).

As may be seen from the formulae for the state metrics ($\alpha$ and $\beta$) computations in the Max-Log-MAP decoding and the Viterbi decoding, a common operation used is a maximum of a number of sums. In the case of a radix-4 trellis, the maximum number may be 4. In hardware, the computations may be performed in an add-compare-select circuit (e.g., circuit 220).

The circuits 222a to 222d may implement adder circuits. Each circuit 222a to 222d may be operational to add a branch metric value and a respective state metric value. The sums may be the "add" portion of the add-compare-select operations.

The circuit 224 may implement a compare and select circuit. The circuit 224 is generally operational to compare the sum values calculated by the circuits 222a to 222d. The circuit 224 may also be operational to select a maximum sum value from among the sum values. The selected maximum sum value may be presented in the signal SM as a new state metric value. The new state metric value may be computed per formula 30 as follows:

$$SM = \max_{i \in \{0,\ldots,3\}} \{SM_i + BM_1\} \quad (30)$$

An index value $i \in \{0, \ldots, 3\}$ of the selected maximum sum value may be presented in the signal IND.

Figure 12:
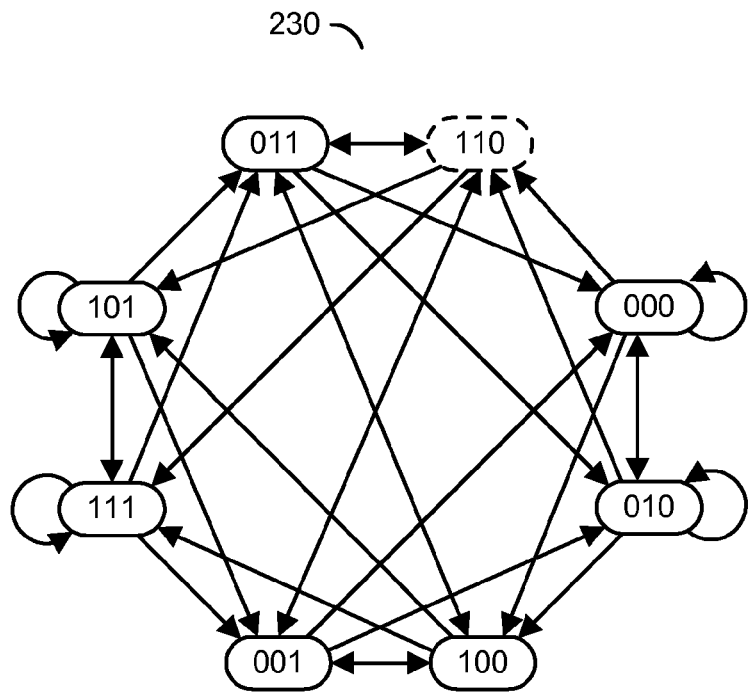
FIG. 12 is a diagram of a universal dependence graph for state metrics calculation.

Referring to FIG. 12, a diagram of a universal dependence graph 230 for state metrics calculation is shown. The graph 230 generally comprises a number (e.g., 8) of states (e.g., 000, 001, 010, 011, 100, 101, 110 and 111). Each state may have two transitions leaving to other states. Each state may have either (i) 4 transitions entering from other states or (ii) 3 transitions entering from other states and a single transition remaining within the state.

Consider a convolutional code with 256 states. A transition graph (e.g., transition graph 200) generally has 64 $K_{4,4}$ components and each component may be processed in parallel in the Viterbi decoding. In the case of turbo codes, subgraphs generally cannot be process in parallel because the state metrics are calculated in each clock cycle. Therefore, the universal dependence graph 230 may be implemented according to the encoder state transition graph (e.g., transition graph 200). By way of example, the graph 230 generally illustrates transitions to the state 110 (e.g., having a zero last bit) from the states 000, 001, 010, 011 (e.g., each having a zero initial bit).

To construct a state metrics calculation circuit, each vertex of the dependent graph 230 may be associated with the circuit 220. The circuits 220 may be inter-connected according to the transitions of the dependent graph 230 to obtain a state metric calculator (SMC) for radix-4 trellis decoding. Each vertex of the dependent graph 230 generally has incoming transitions of degree 4.

Consider a high-speed turbo decoder that calculates state metrics for vertexes in a level $V_t$ of the trellis in parallel in single clock cycle. The state metrics obtained for the level $V_t$ may be used on the next clock cycle for computations of state metrics in next level $V_{t+1}$. Therefore, the SMC generally cannot be pipelined. For encoders used in different communications standards, different trellises may be used and so multiplexers may be implemented at the input ports of the ACS circuits in some designs. However, the dependence graphs for several communications standards, such as W-CDMA, LTE, CDMA2000 and WiMAX, may be isomorphic to the dependence graph 230 shown in FIG. 12. Therefore, instead of using multiplexers at the input ports of the ACS circuit, some embodiments of the present invention may implement a configurable Branch Metrics Calculator. The configurable BMC generally calculates branch metrics (©) and permutes the branch metrics according to the communications standard.

Figure 13:
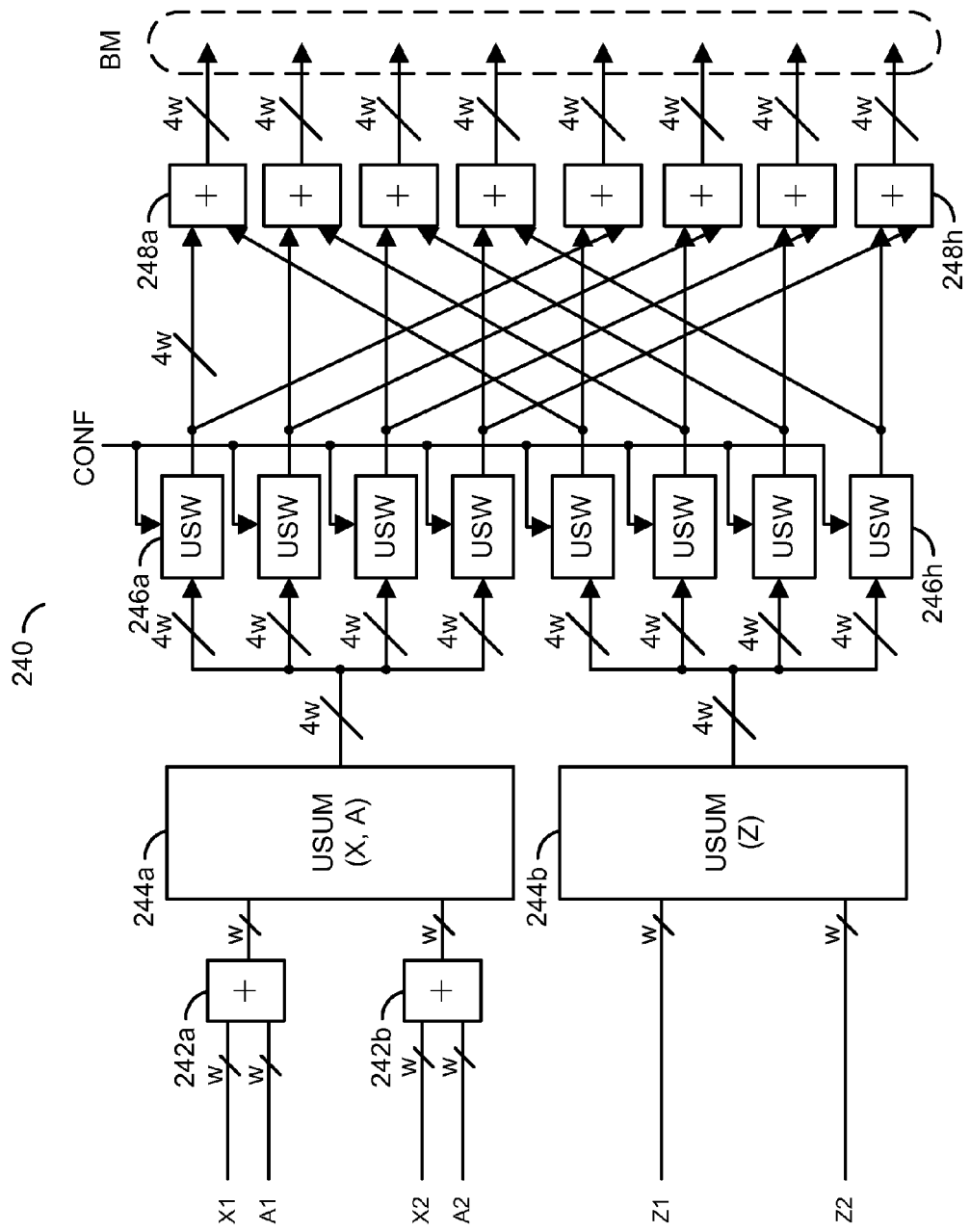
FIG. 13 is a block diagram of an apparatus in accordance with a preferred embodiment of the present invention.

Referring to FIG. 13, a block diagram of an apparatus 240 is shown in accordance with a preferred embodiment of the present invention. The apparatus (or device or circuit) 240 may implement a universal (configurable) branch metrics calculator circuit. The circuit 240 generally comprises multiple circuits (or modules) 242a to 242b, multiple circuits (or modules) 244a to 244b, multiple circuits (or modules) 246a to 246h and multiple circuits (or modules) 248a to 248h. The circuits 242a to 248h may represent modules and/or blocks that may be implemented as hardware, firmware, software, a combination of hardware, firmware and/or software, or other implementations.

The circuit 242a may receive a signal (e.g., X1) and a signal (e.g., A1). The circuit 242b may receive a signal (e.g., X2) and a signal (e.g., A2). A signal (e.g., Z1) may be received by the circuit 244b. A signal (e.g., Z2) may also be received by the circuit 244b. A sum of the signals X1 and A1 may be presented from the circuit 242a to the circuit 244a. A sum of the signals X2 and A2 may be presented from the circuit 242b to the circuit 244a. The circuit 244a may generate a sum value that is presented to the circuits 246a to 246d. The circuit 244b may generate a sum value that is presented to the circuits 246e to 246h. A signal (e.g., CONF) may be received by each circuit 246a to 246h. Each circuit 248a to 248h may receive a permuted value from different pairs of the circuits 246a to 246h. A signal (e.g., BM) may be created by a combination of the sum values generated by the circuits 248a to 248h.

The signals X1, X2 may convey soft LLR values for the information bits x1,x2. The signals A1,A2 may carry a priori soft LLR values for the information bits x1,x2. The signals Z1,Z2 may carry soft LLR values for the parity bits z1,z2. By way of example, each soft value may have a bit-width of w. The signal CONF may carry configuration information that identifies a particular communications standard from among several communications standards that the circuit 240 may process.

Each circuit 242a to 242b may implement an adder circuit. The circuits 242a to 242b may be operational to add the soft LLR values received in the respective signals X1,A1 and X2,A2 to calculate a sum value.

Each circuit 244a to 244b may implement a universal sum circuit. The circuits 244a to 244b are generally operational to calculate several (e.g., 4) output values (e.g., $Y_{00}, Y_{01}, Y_{10}, Y_{11}$) from multiple (e.g., 2) input values (e.g., $R_0, R_1$). The output values may be calculated according to formula 31 as follows:

$$Y_{x_0x_1} = (-1)^{x_0}R_0 + (-1)^{x_1}R_1 \quad (31)$$

where $x_0x_1 \in \{00,01,10,11\}$.

Each circuit 246a to 246h may implement a universal switch (USW) circuit. The circuits 246a to 246h may by operational to permute the output values received from the circuits 244a to 244b to generate the permuted values presented to the circuits 248a to 248h. Control of the permutations may be provided through the signal CONF. The signal CONF generally comprises multiple control bits (e.g., a different set of bits σ, σ0, σ1 for each circuit 246a to 246h). Each permutation generally corresponds to the permutation that performs on set {00,01,10,11} finite state automaton.

Figure 14:
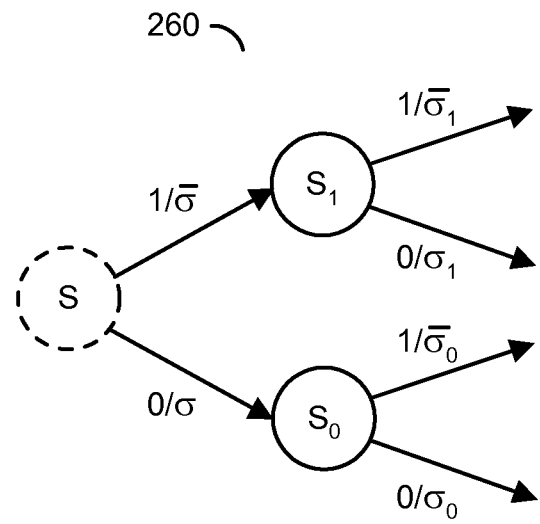
FIG. 14 is a diagram of a state transition diagram.

Referring to FIG. 14, a diagram of a state transition diagram 260 is shown. The finite state automation may be performed in accordance with the state transition diagram 260. For each communications standard, a set of permutations (σ, σ0, σ1) may be defined (e.g., a respective permutation for each of the circuits 246a to 246h). For eight circuits 246a to 246h, a width of the signal CONF may be 3×8=24 bits.

Returning to FIG. 13, the permutations of the circuits 246a to 246h may generate $XSW_{ij}$ (the j-th output of i-th circuit 246a to 246h connected to the circuit 244a) and $ZSW_{ij}$ (the j-th output of i-th circuit 246a to 246h connected to the circuit 244b), for i=0, . . . , 7 and j=0, . . . , 3.

Each circuit 248a to 248h may implement an adder circuit. The circuits 248a to 248h are generally operational to add the permuted values received from the circuits 246a to 246h to generate the branch metrics values. The branch metrics value may be calculated according to formula 32 as follows:

$$BM_{ij}=XSW_{ij}+ZSW_{ij}, i=0,\ldots,7; j=0,\ldots,3 \quad (32)$$

in which $BM_{ij}$ may be a branch metric that corresponds to the j-th clockwise edge from i-th state (in binary representation $A_2A_1A_0$) on the dependence graph 230 A combination of the individual branch metrics values may be presented in the signal BM.

The circuit 240 may be pipelined. For example, an initial pipeline stage may be created with the circuits 242a, 242b, 244a and 244b. A next pipeline stage may be formed with the circuits 246a to 246h and 248a to 248h. Other pipeline arrangements may be implemented to meet the criteria of a particular application. Therefore, the circuit 240 generally does not restrict a performance of the decoder.

Figure 15:
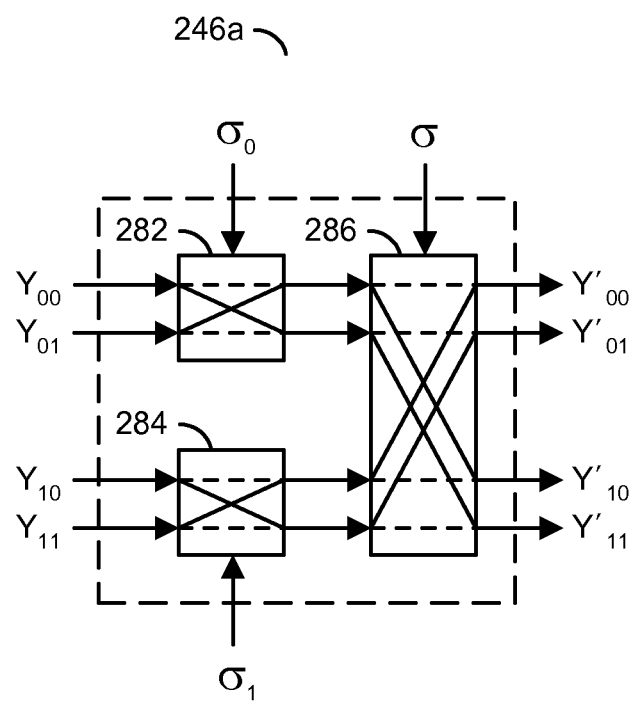
FIG. 15 is a block diagram of an example implementation of a universal switch circuit.

Referring to FIG. 15, a block diagram of an example implementation of the circuit 246a is shown. The implementation may also be applicable to the other circuits 246b to 246h. The circuit 246 generally comprises a circuit (or module) 282, a circuit (or module) 284 and a circuit (or module) 286. The circuit 246a may implement a universal permutations 4×4-network. The circuits 282 to 286 may represent modules and/or blocks that may be implemented as hardware, firmware, software, a combination of hardware, firmware and/or software, or other implementations.

The circuit 282 may receive the values $Y_{00}$ and $Y_{01}$ from the circuit 244a and the value σ0 from the signal CONF. The values $Y_{10}$ and $Y_{11}$ may be received by the circuit 284 from the circuit 244a and the value σ1 from the signal CONF. The circuit 286 may receive the permuted values from the circuits 282 and 284. The circuit 286 may also receive the value σ from the signal CONF. Permuted signals (e.g., $Y'_{00}, Y'_{01}, Y'_{10}$ and $Y'_{11}$) may be generated by the circuit 286 and presented to the circuits 248a to 248h.

Each circuit 282, 284 and 286 may implement a multiplexer circuit. The circuit 282 may be operational to permute the values $Y_{00}$ and $Y_{01}$ in response to the value σ0. While the value σ0 is a logical 1, the values $Y_{00}$ and $Y_{01}$ may be passed straight through. While the value σ0 is a logical 0, the values $Y_{00}$ and $Y_{01}$ may be exchanged. The circuit 284 may be operational to permute the values $Y_{10}$ and $Y_{11}$ in response to the value σ1. While the value of is a logical 1, the values $Y_{10}$ and $Y_{11}$ may be passed straight through. While the value σ1 is a logical 0, the values $Y_{10}$ and $Y_{11}$ may be exchanged. The circuit 286 may be operational to permute the values received from the circuits 282 and 284 in response to the value σ. While the value σ is a logical 1, (i) the values received from the circuit 282 may be passed straight through as the values $Y'_{00}$ and $Y'_{01}$ and (ii) the values received from the circuit 284 may be passed straight through as the values $Y'_{10}$ and $Y'_{11}$. While the value σ is a logical 0, the two values received from the circuit 282 may be exchanged with the two values received from the circuit 284. The resulting permutation for each value $Y_{00}, Y_{01}, Y_{10}$ and $Y_{11}$ is generally illustrated by the state transition diagram 260.

Some embodiments of the present invention may implement a configurable BMC circuit instead of implementing multiplexers at the input ports of the ACS circuit. The configurable BMC circuit generally supports multiple communications standards. An ordinary way to support multiple standards in single decoder is to implement multiplexers in a SMC circuit along a main path through the decoder. By using the configurable BMC circuit, the main path through the SMC circuit may be free from the multiplexers. Furthermore, the universal switch circuits used in the BMC circuit generally occupy a low silicon area, but at the same time may support any permutations of branch metrics arising in various wired and/or wireless communications standards.

The functions performed by the diagrams of FIGS. 1-15 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors of the machine implementation.

The present invention may also be implemented by the preparation of ASICs (application specific integrated circuits), Platform ASICs, FPGAs (field programmable gate arrays), PLDs (programmable logic devices), CPLDs (complex programmable logic device), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, storage and/or playback devices, video recording, storage and/or playback devices, game platforms, peripherals and/or multi-chip modules. Those skilled in the relevant art(s) would understand that the elements of the invention may be implemented in other types of devices to meet the criteria of a particular application.

As would be apparent to those skilled in the relevant art(s), the signals illustrated in FIGS. 11, 12 and 15 represent logical data flows. The logical data flows are generally representative of physical data transferred between the respective blocks by, for example, address, data, and control signals and/or busses. The system represented by the apparatuses 220, 240 and 246a may be implemented in hardware, software or a combination of hardware and software according to the teachings of the present disclosure, as would be apparent to those skilled in the relevant art(s).

While the invention has been particularly shown and described with reference to the preferred embodiments thereof, it will be understood by those skilled in the art that various changes in form and details may be made without departing from the scope of the invention.

The invention claimed is:

1. A method for branch metric calculation in a plurality of communications standards, comprising the steps of:
   (A) calculating a first set of a plurality of sum values by adding a plurality of first values related to a plurality of information bits and a plurality of second values related to said information bits using a circuit;
   (B) calculating a second set of said sum values by adding a plurality of third values related to a plurality of parity bits;
   (C) generating a plurality of permutated values by permutating said sum values based on a configuration signal, wherein said configuration signal identifies a current one of said communications standards; and
   (D) generating a plurality of branch metrics values by adding pairs of said permutated values.

2. The method according to claim 1, further comprising the step of:
   trellis decoding said information bits in response to said branch metrics values.

3. The method according to claim 2, wherein (i) said trellis decoding comprises a radix-4 trellis decoding and (ii) said first set comprises four values.

4. The method according to claim 1, wherein (i) said first values comprise a plurality of soft logarithms of likelihood ratios of said information bits, (ii) said second values comprise a plurality of a priori soft logarithms of likelihood ratios of said information bits and (iii) and said third values comprise a plurality of soft logarithms of likelihood ratios of said parity bits.

5. The method according to claim 1, wherein a first half of said permutations are performed on said first set of said sum values and a second half of said permutations are performed on said second set of said sum values.

6. The method according to claim 1, wherein each of said permutations performs a different permutation.

7. The method according to claim 1, further comprising the step of:
   adding said first values to said second values prior to said calculating of said first set of said sum values.

8. The method according to claim 1, wherein said permutating comprises the steps of:
   generating a plurality of first intermediate values by switching a first portion of said sum values in response to said configuration signal;
   generating a plurality of second intermediate values by switching a second portion of said sum values in response to said configuration signal; and
   generating said permutated values by switching said first intermediate values and said second intermediate values in response to said configuration signal.

9. The method according to claim 1, wherein said communications standards include at least two of (i) a Long Term Evolution (LTE) standard, (ii) an Institute of Electrical and Electronics Engineering (IEEE) 802.16 standard, (iii) a Wideband-CDMA/High Speed Packet Access (WCDMA/HSPA) standard and (iv) a CDMA-2000/Ultra Mobile Broadband (UMB) standard.

10. An apparatus comprising:
    a first circuit configured to (i) calculate a first set of a plurality of sum values by adding a plurality of first values related to a plurality of information bits and a plurality of second values related to said information bits and (ii) calculate a second set of said sum values by adding a plurality of third values related to a plurality of parity bits;
    a second circuit configured to generate a plurality of permutated values by permutating said sum values based on a configuration signal, wherein said configuration signal identifies a current one of a plurality of communications standards; and
    a third circuit configured to generate a plurality of branch metrics values by adding pairs of said permutated values.

11. The apparatus according to claim 10, further comprising a trellis decoder configured to decode said information bits in response to said branch metrics values.

12. The apparatus according to claim 11, wherein (i) said trellis decoder comprises a radix-4 trellis decoder and (ii) said first set comprises four values.

13. The apparatus according to claim 10, wherein (i) said first values comprise a plurality of soft logarithms of likelihood ratios of said information bits, (ii) said second values comprise a plurality of a priori soft logarithms of likelihood ratios of said information bits and (iii) and said third values comprise a plurality of soft logarithms of likelihood ratios of said parity bits.

14. The apparatus according to claim 10, wherein a first half of said permutations are performed on said first set of said sum values and a second half of said permutations are performed on said second set of said sum values.

15. The apparatus according to claim 10, wherein each of said permutations performs a different permutation.

16. The apparatus according to claim 10, further comprising a fourth circuit configured to add said first values to said second values prior to said calculating of said first set of said sum values.

17. The apparatus according to claim 10, wherein said permutating comprises (i) generating a plurality of first intermediate values by switching a first portion of said sum values in response to said configuration signal, (ii) generating a plurality of second intermediate values by switching a second portion of said sum values in response to said configuration signal and (iii) generating said permutated values by switching said first intermediate values and said second intermediate values in response to said configuration signal.

18. The apparatus according to claim 10, wherein said communications standards include at least two of (i) a Long Term Evolution (LTE) standard, (ii) an Institute of Electrical and Electronics Engineering (IEEE) 802.16 standard, (iii) a Wideband-CDMA/High Speed Packet Access (WCDMA/HSPA) standard and (iv) a CDMA-2000/Ultra Mobile Broadband (UMB) standard.

19. The apparatus according to claim 10, wherein said apparatus is implemented as one or more integrated circuits.

20. An apparatus comprising:
    means for calculating a first set of a plurality of sum values by adding a plurality of first values related to a plurality of information bits and a plurality of second values related to said information bits;
    means for calculating a second set of said sum values by adding a plurality of third values related to a plurality of parity bits;
    means for generating a plurality of permutated values by permutating said sum values based on a configuration signal, wherein said configuration signal identifies a current one of a plurality of communications standards; and
    means for generating a plurality of branch metrics values by adding pairs of said permutated values.

* * * * *